(12) United States Patent
Furuta et al.

(10) Patent No.: US 8,927,875 B2
(45) Date of Patent: Jan. 6, 2015

(54) WIRING BOARD AND METHOD FOR MANUFACTURING WIRING BOARD

(75) Inventors: Toru Furuta, Ogaki (JP); Fumitaka Takagi, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 197 days.

(21) Appl. No.: 13/562,508

(22) Filed: Jul. 31, 2012

(65) Prior Publication Data

US 2013/0192877 A1 Aug. 1, 2013

Related U.S. Application Data

(60) Provisional application No. 61/552,841, filed on Oct. 28, 2011.

(51) Int. Cl.
| | |
|---|---|
| *H05K 1/03* | (2006.01) |
| *H05K 3/34* | (2006.01) |
| *H05K 1/02* | (2006.01) |
| *H05K 3/10* | (2006.01) |
| *H05K 1/11* | (2006.01) |
| *H05K 3/46* | (2006.01) |

(52) U.S. Cl.
CPC ............. *H05K 1/0296* (2013.01); *H05K 1/114* (2013.01); *H05K 3/3452* (2013.01); *H05K 3/4652* (2013.01); *H05K 3/10* (2013.01)
USPC .......................................... 174/255; 361/760

(58) Field of Classification Search
CPC ....... H05K 1/0296; H05K 1/114; H05K 3/10; H05K 3/3452; H05K 3/4652
USPC ................. 174/255, 256, 257, 258, 260, 261; 361/760, 761, 767; 29/846, 831, 852
See application file for complete search history.

(56) References Cited

U.S. PATENT DOCUMENTS

| | | | | |
|---|---|---|---|---|
| 8,592,691 | B2 * | 11/2013 | Furuta et al. | 174/262 |
| 2004/0209395 | A1 * | 10/2004 | Yang et al. | 438/106 |
| 2006/0226544 | A1 * | 10/2006 | Hsu et al. | 257/737 |
| 2008/0093109 | A1 * | 4/2008 | Hsu et al. | 174/250 |
| 2008/0314632 | A1 * | 12/2008 | Wu et al. | 174/263 |
| 2010/0218983 | A1 * | 9/2010 | Furuta et al. | 174/257 |

FOREIGN PATENT DOCUMENTS

JP 2000-077471 3/2000

* cited by examiner

*Primary Examiner* — Yuriy Semenenko
(74) *Attorney, Agent, or Firm* — Oblon, Spivak, McClelland, Maier & Neustadt, L.L.P.

(57) ABSTRACT

A wiring board includes an interlayer insulation layer, conductive patterns formed on the interlayer insulation layer, and a solder-resist layer formed on the interlayer insulation layer and having an opening partially exposing the conductive patterns. The solder-resist layer has an edge portion bordering the opening and intersecting the conductive patterns, and the edge portion of the solder-resist layer has a concavo-convex shape having convex portions and concave portions such that the convex portions and the concave portions are alternately intersecting the conductive patterns.

20 Claims, 20 Drawing Sheets

WIRING BOARD AND METHOD FOR MANUFACTURING WIRING BOARD

CROSS-REFERENCE TO RELATED APPLICATIONS

The present application is based on and claims the benefit of priority to U.S. Application No. 61/552,841, filed Oct. 28, 2011, the entire contents of which are incorporated herein by reference.

BACKGROUND OF THE INVENTION

1. Field of the Invention

The present invention relates to a wiring board and its manufacturing method.

2. Discussion of the Background

In small-size electronic devices typified by mobile communication terminals, mounting space is limited for components that form electronic circuits. Japanese Laid-Open Patent Publication No. 2000-77471 describes a wiring board where a wider pad is formed in the center of a conductor exposed through an opening of a solder-resist layer. The contents of Japanese Laid-Open Patent Publication No. 2000-77471 are incorporated herein by reference in their entirety in this application.

SUMMARY OF THE INVENTION

According to one aspect of the present invention, a wiring board includes an interlayer insulation layer, conductive patterns formed on the interlayer insulation layer, and a solder-resist layer formed on the interlayer insulation layer and having an opening partially exposing the conductive patterns. The solder-resist layer has an edge portion bordering the opening and intersecting the conductive patterns, and the edge portion of the solder-resist layer has a concavo-convex shape having convex portions and concave portions such that the convex portions and the concave portions are alternately intersecting the conductive patterns.

According to another aspect of the present invention, a method for manufacturing a wiring board includes forming conductive patterns on an insulation layer, forming on the insulation layer a solder-resist layer covering the conductive patterns, and forming an opening in the solder-resist layer such that the conductive patterns are partially exposed from the solder-resist layer. The forming of the opening includes forming in the solder-resist layer an edge portion intersecting the conductive patterns having a concavo-convex shape having convex portions and concave portions such that the convex portions and the concave portions are alternately intersecting the conductive patterns.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
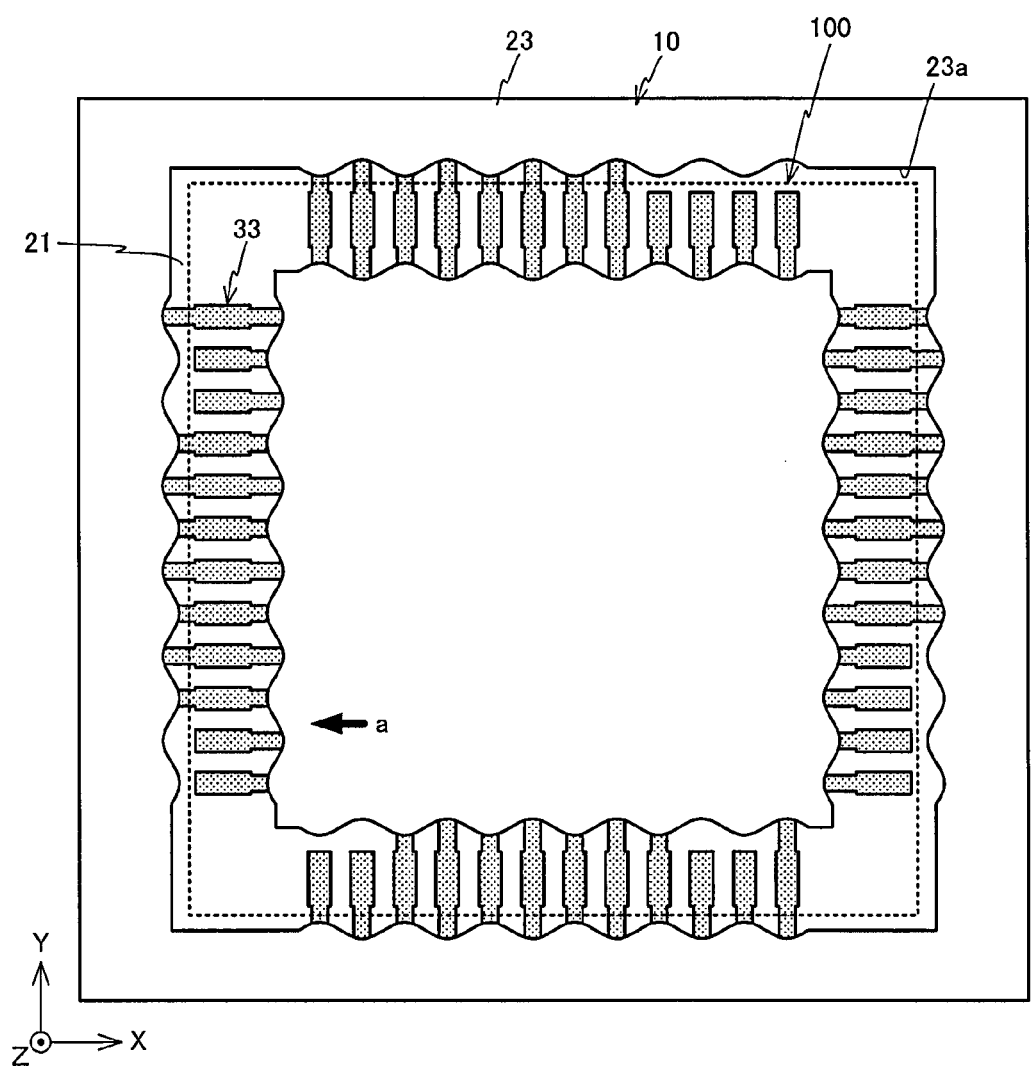
FIG. 1 is a plan view of a wiring board according to an embodiment of the present invention.

The embodiments will now be described with reference to the accompanying drawings, wherein like reference numerals designate corresponding or identical elements throughout the various drawings.

For description purposes, a coordinate system is used where axes (X, Y, Z) intersect at right angles with each other.

FIG. 1 shows a plan view of wiring board 10 according to the present embodiment. Wiring board 10 is a printed wiring board. On an upper surface of wiring board 10 (a surface on the (+Z) side), electronic component 100 is flip-chip mounted.

Figure 2:
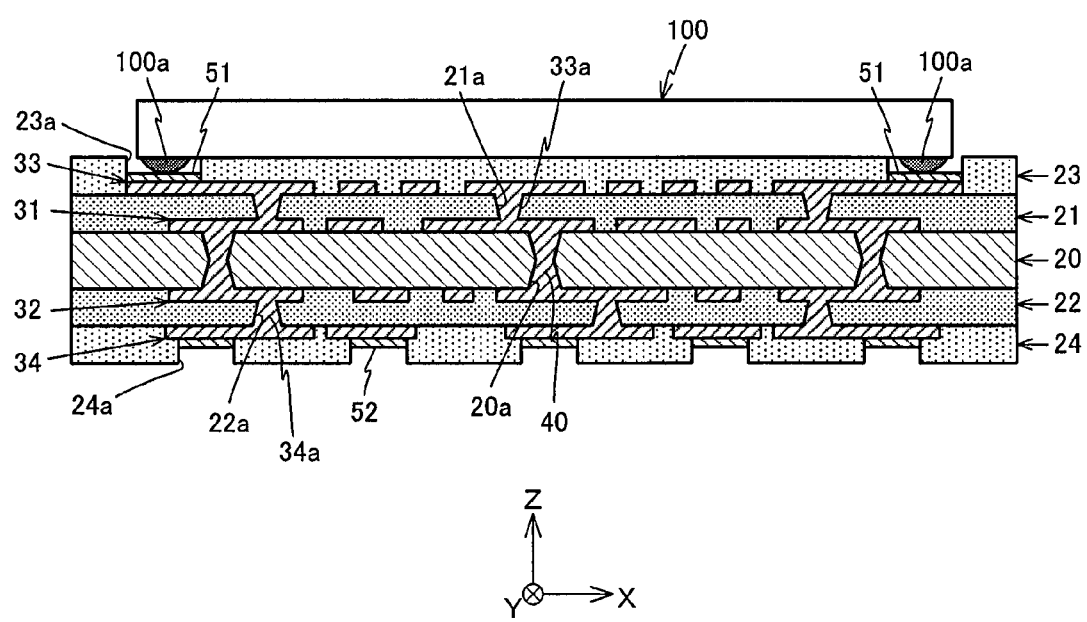
FIG. 2 is a cross-sectional view of a wiring board according to the embodiment of the present invention.

FIG. 2 is a ZX cross-sectional view of wiring board 10. As shown in FIG. 2, wiring board 10 has core substrate 20, conductive patterns (31, 32, 33, 34), insulation layers (21, 22) and solder-resist layers (23, 24).

Core substrate 20 is formed by impregnating glass fiber or aramid fiber, for example, with epoxy resin. As shown in FIG. 2, penetrating hole (20a) is formed in core substrate 20.

Through-hole conductor 40 is formed in penetrating hole (20a). Such through-hole conductor 40 is made of copper plating. Through-hole conductor 40 is formed by plating on the inner-wall surface of a through hole, or filling plating in penetrating hole (20a) as shown in FIG. 2.

Conductive pattern 31 is formed on the upper surface of core substrate 20. Also, conductive pattern 32 is formed on the lower surface (a surface on the (−Z) side) of core substrate 20. Conductive patterns (31, 32) each form part of the electronic circuits of wiring board 10 and are patterned in predetermined shapes. Such conductive patterns (31, 32) are electrically connected by through-hole conductor 40.

Insulation layer 21 is formed to cover the upper surface of core substrate 20. Insulation layer 21 is made of prepreg. Then, conductive pattern 31 is formed on the upper surface of core substrate 20, and conductive pattern 33 is formed on the upper surface of insulation layer 21.

Prepreg is made by impregnating inorganic fiber such as glass fiber, for example, with epoxy resin.

Multiple via holes (21a) are formed in insulation layer 21. Via conductor (33a) is formed in via hole (21a) by copper plating. Via conductor (33a) is made of copper plating filled in via hole (21a). Alternatively, via conductor (33a) may be formed by plating the inner-wall surface of via hole (21a).

Insulation layer 22 is formed to cover the lower surface of core substrate 20. Insulation layer 22 is made of prepreg, the same as insulation layer 21. Then, conductive pattern 32 is formed on the upper surface of core substrate 20, and conductive pattern 34 is formed on the upper surface of insulation layer 22.

Multiple via holes (22a) are formed in insulation layer 22. Via conductor (34a) is formed in via hole (22a) by copper plating. Via conductor (34a) is made of copper plating filled in via hole (22a). Alternatively, via conductor (34a) may be formed by plating the inner-wall surface of via hole (22a).

Conductive pattern 33 is formed on the upper surface of insulation layer 21. Also, conductive pattern 34 is formed on the lower surface of insulation layer 22. Conductive patterns (33, 34) each form part of the electronic circuits of wiring board 10, and are patterned in predetermined shapes. Then, conductive pattern 33 is electrically connected to conductive pattern 31 by via conductor (33a) formed in insulation layer 21. Also, conductive pattern 34 is electrically connected to conductive pattern 32 by via conductor (34a) formed in insulation layer 22. Conductive pattern 33 includes a solder pad to be connected to a connection terminal of an IC chip. Also, conductive pattern 34 includes a solder pad to be connected to an external board such as a motherboard.

Solder-resist layer 23 is formed to cover the upper surface of insulation layer 21. Also, solder-resist layer 24 is formed to cover the lower surface of insulation layer 22. Solder-resist layers (23, 24) are each made of UV-curable resin or the like, for example.

Figure 3:
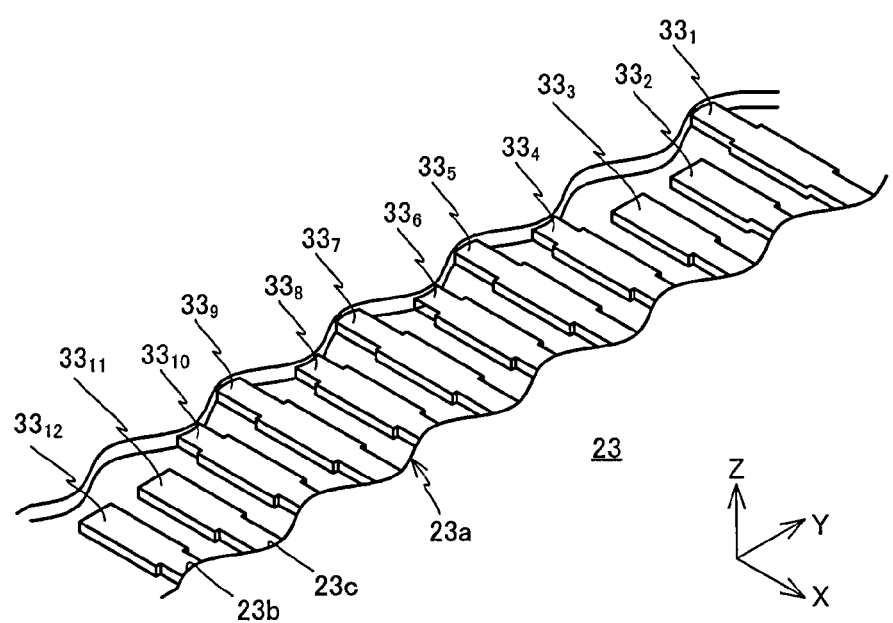
FIG. 3 is a perspective view showing part of an opening formed in a solder-resist layer.

As seen in FIG. 1, frame-shaped opening (23a) is formed in solder-resist layer 23. Multiple (48) conductive patterns 33 formed on the upper surface of insulation layer 21 are exposed through opening (23a). When one conductive pattern $33_N$ (N=1, 2, 3, ...) is defined as a first conductive pattern, conductive patterns ($33_{N+1}$, $33_{N-1}$), which are respectively positioned adjacent to it, are defined as second conductive patterns. First conductive patterns and second conductive patterns are alternately positioned (see FIG. 3). As shown in FIG. 3, it is an option for the wiring width of conductive patterns 33 to be partially widened. It is also an option for their wiring width to be constant.

FIG. 3 is a magnified perspective view of a portion shown by arrow (a) in FIG. 1. As shown in FIG. 3, a rectangular pad is formed in a portion of conductive pattern 33 exposed through opening (23a). By alternately forming convex portions (23b) to protrude into opening (23a) and concave portions (23c) to be recessed outward from opening (23a), the inner-walls of opening (23a) of solder-resist layer 23 are shaped like a sine wave where concavo-convex shapes appear in a cycle. Also, in the present embodiment, a convex portion (23b) formed on the outer-side inner wall of opening (23a) faces a convex portion (23b) formed on the inner-side inner wall, and a concave portion (23c) formed on the outer-side inner wall of opening (23a) faces a concave portion (23c) formed on the inner-side inner wall.

Figure 4:
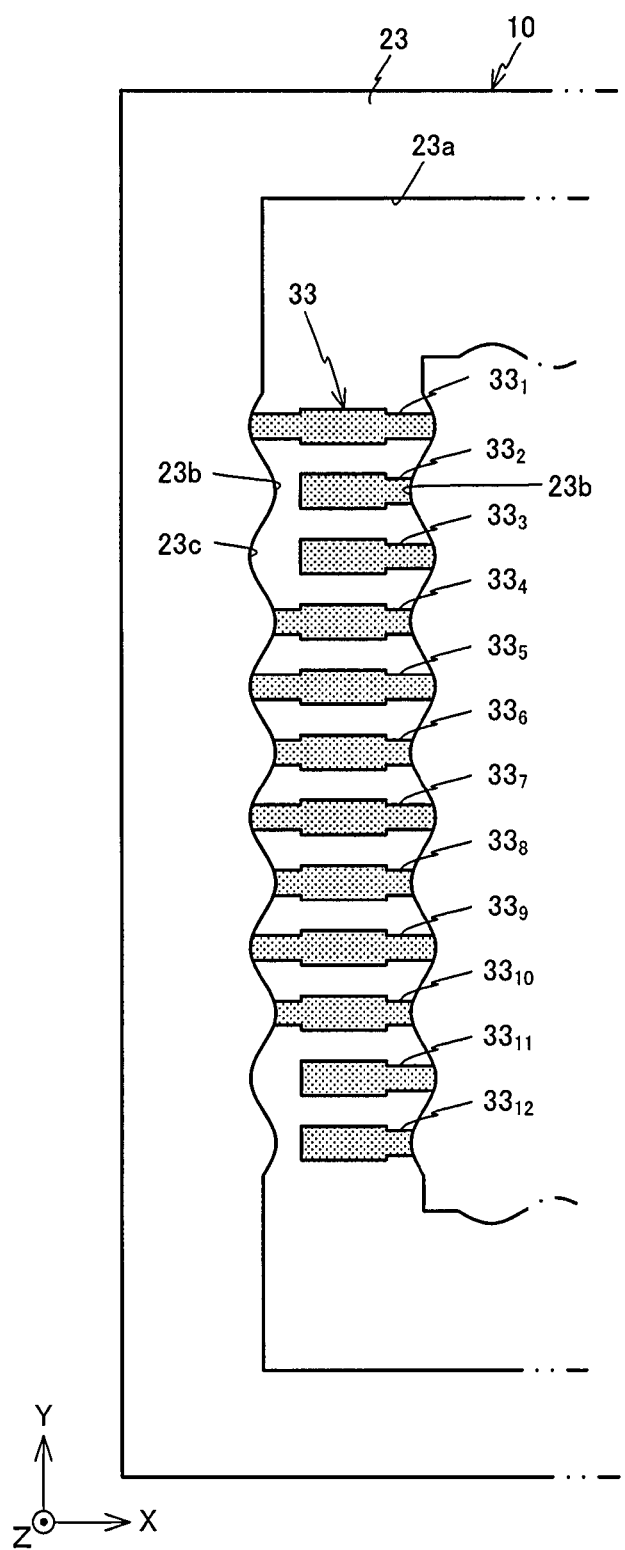
FIG. 4 is a plan view showing part of the opening formed in a solder-resist layer.

FIG. 4 is a magnified plan view of opening (23a). As shown in FIG. 4, in opening (23a) of wiring board 10, conductive patterns 33 are positioned every 40 μm, for example. As shown in FIG. 4, such conductive patterns 33 are positioned corresponding either to convex portion (23b) or concave portion (23c). In doing so, every other conductive pattern 33 overlaps a convex portion (23b), and part of the pattern is covered by the overlapping convex portion (23b).

As shown in FIG. 2, the surfaces of conductive patterns 33 exposed through opening (23a) are covered with solder connection layer 51. Solder connection layer 51 is double layered with Sn-plated film or nickel-plated film and with gold-plated film.

Multiple openings (24a) are formed in solder-resist layer 24. Conductive patterns 34 formed on the lower surface of insulation layer 22 are exposed through openings (24a). Surfaces of conductive patterns 34 exposed through openings (24a) are covered with solder connection layer 52.

Electronic component 100 is mounted on the upper surface of solder-resist layer 23. On the lower surface of electronic component 100, multiple pads (100a) are formed along the outer periphery of electronic component 100. Then, pads (100a) are electrically connected to conductive patterns 33 exposed from solder-resist layer 23.

Next, a method for manufacturing wiring board 10 on which to mount electronic component 100 is described.

Figure 5:
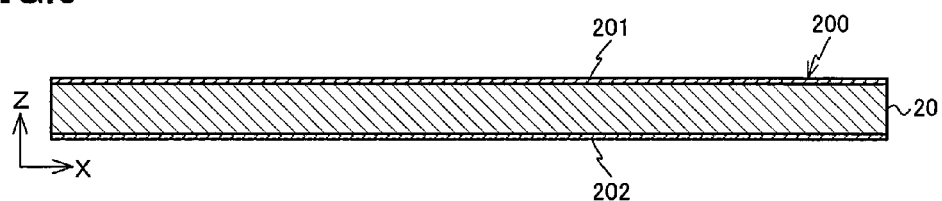
FIG. 5 is a view illustrating a step for manufacturing a wiring board.

First, as shown in FIG. 5, copper-clad laminate 200, which is made up of core substrate 20 and copper foils (201, 202) laminated respectively on upper and lower surfaces of core substrate 20, is prepared. Then, a black-oxide treatment is conducted on surfaces of copper foils (201, 202) laminated on copper-clad laminate 200.

Figure 6:
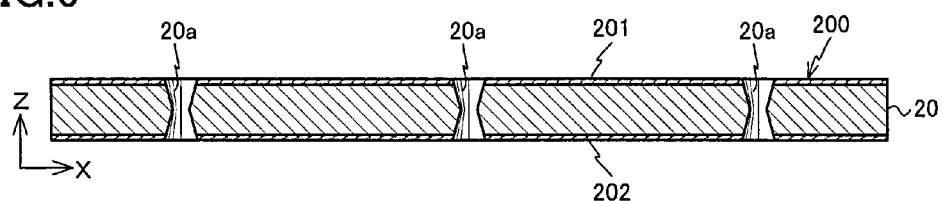
FIG. 6 is a view illustrating a step for manufacturing a wiring board.

Next, laser light is irradiated from the upper-surface side of copper-clad laminate 200 toward the upper surface of copper-clad laminate 200, and laser light is irradiated from the lower-surface side of copper-clad laminate 200 toward the lower surface of copper-clad laminate 200. Accordingly, penetrating holes (20a) are formed in copper-clad laminate 200 as shown in FIG. 6. Alternatively, penetrating holes (20a) may be formed in copper-clad laminate 200 by irradiating laser light either from the upper-surface side or the lower-surface side of copper-clad laminate 200. Yet alternatively, a drill or the like may also be used to form penetrating holes (20a) in copper-clad laminate 200.

Figure 7:
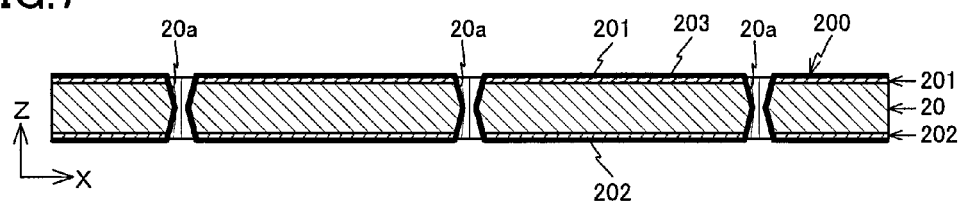
FIG. 7 is a view illustrating a step for manufacturing a wiring board.
Figure 8:
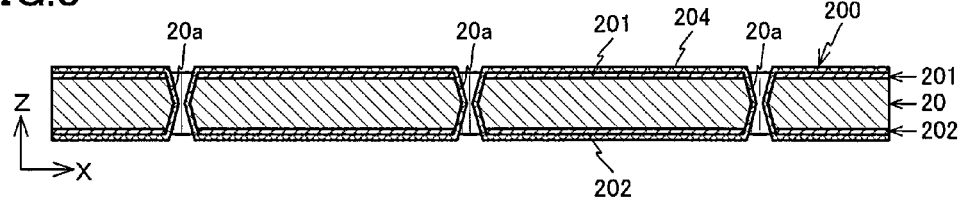
FIG. 8 is a view illustrating a step for manufacturing a wiring board.

Next, as shown in FIG. 7, catalyst 203 mainly containing palladium Pd, for example, is attached to the surfaces of copper-clad laminate 200 and the inner walls of penetrating holes (20a). Then, electroless copper plating is performed on copper-clad laminate 200. Accordingly, electroless plated film 204 is formed as a seed layer on the surfaces of copper-clad laminate 200 and the inner walls of penetrating holes (20a) as shown in FIG. 8.

Figure 9:
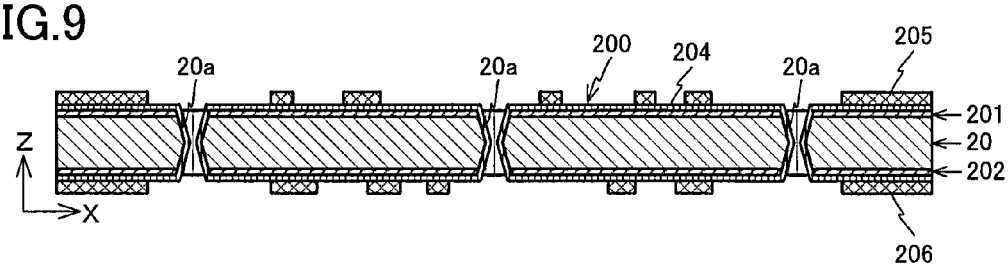
FIG. 9 is a view illustrating a step for manufacturing a wiring board.
Figure 10:
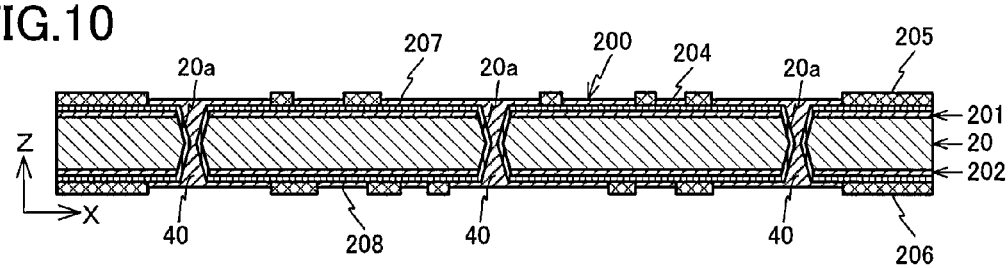
FIG. 10 is a view illustrating a step for manufacturing a wiring board.

Next, as shown in FIG. 9, plating resist 205 is formed on the upper surface of copper-clad laminate 200 where electroless plated film 204 is formed, and plating resist 206 is formed on the lower surface of copper-clad laminate 200. Then, electrolytic copper plating is performed on electroless plated film 204 exposed from plating resists (205, 206). Accordingly, as shown in FIG. 10, electrolytic plated film 207 is formed on the upper surface of copper-clad laminate 200, and electrolytic plated film 208 is formed on the lower surface of copper-clad laminate 200. In addition, plating is filled in penetrating holes (20a), making through-hole conductors 40.

Figure 11:
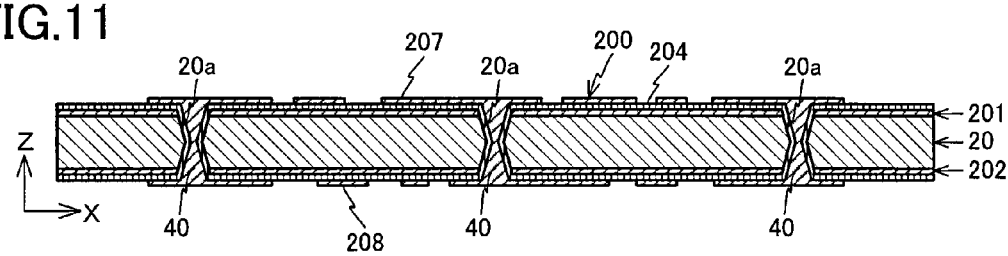
FIG. 11 is a view illustrating a step for manufacturing a wiring board.
Figure 12:
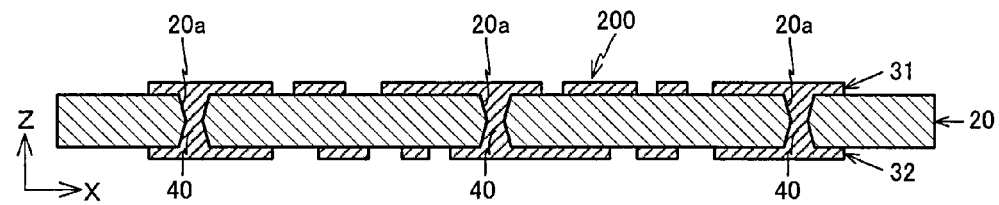
FIG. 12 is a view illustrating a step for manufacturing a wiring board.

Next, as shown in FIG. 11, plating resists (205, 206) are removed from copper-clad laminate 200. Then, etching is performed on copper-clad laminate 200 from which plating resists (205, 206) are removed so that portions of electroless plating 204 and copper foils (201, 202) covered by plating resists (205, 206) are removed. In doing so, copper foils (201, 202), electroless plated film 204 and electrolytic plated films (207, 208) are patterned to form conductive patterns (31, 32) as shown in FIG. 12.

Figure 13:
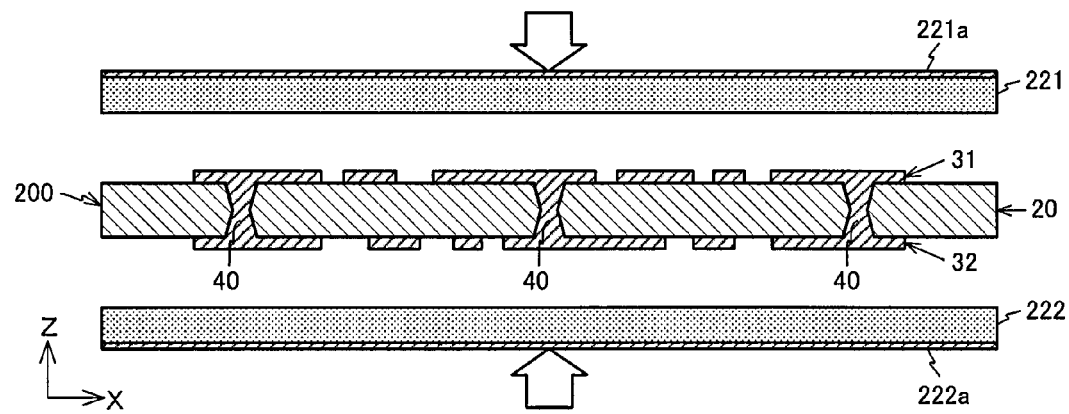
FIG. 13 is a view illustrating a step for manufacturing a wiring board.
Figure 14:
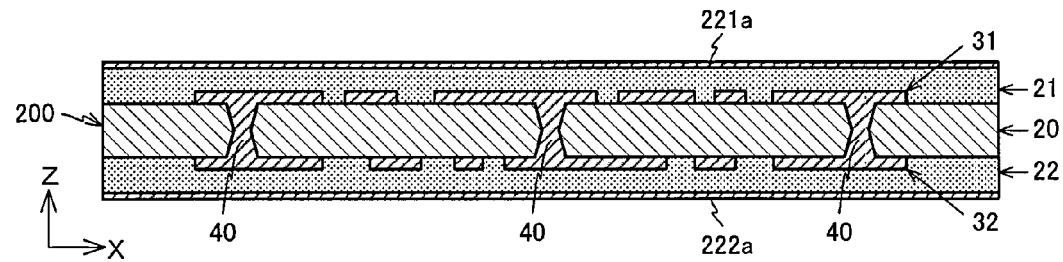
FIG. 14 is a view illustrating a step for manufacturing a wiring board.

Next, as shown in FIG. 13, prepregs (221, 222) are respectively placed on the upper and lower surfaces of copper-clad laminate 200. Copper foil (221a) is laminated on the upper surface of prepreg 221, and copper foil (222a) is laminated on the lower surface of prepreg 222. Then, lamination treatment is conducted on prepregs (221, 222) to pressurize prepregs (221, 222) onto copper-clad laminate 200. Accordingly, as shown in FIG. 14, insulation layer 21 is formed on the upper surface of core substrate 20 covering conductive patterns 31, and insulation layer 22 is formed on the lower surface of core substrate 20 covering conductive patterns 32. Insulation layers (21, 22) may also be formed using thermosetting resin which does not contain glass fiber but contains inorganic filler. In such a case, conductive patterns may be formed using a semi-additive method.

Figure 15:
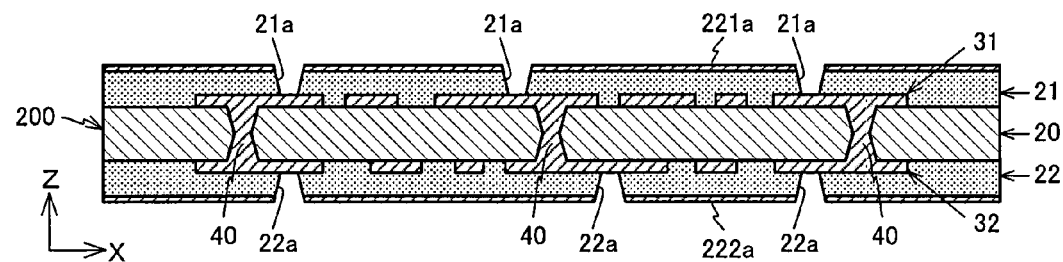
FIG. 15 is a view illustrating a step for manufacturing a wiring board.

Next, black-oxide treatment is conducted on surfaces of copper foil (221a) laminated on the upper surface of insulation layer 21 and of copper foil (222a) laminated on the lower surface of insulation layer 22. Then, laser light is irradiated at insulation layers (21, 22) to form via holes (21a, 22a) in insulation layers (21, 22) with their inner diameters increasing outward as shown in FIG. 15. Next, desmearing is conducted to remove smears remaining inside via holes (21a, 22a).

Figure 16:
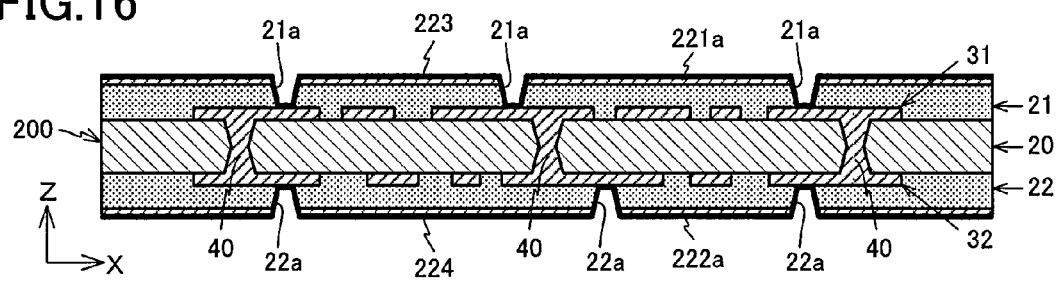
FIG. 16 is a view illustrating a step for manufacturing a wiring board.

Next, copper-clad laminate 200 is immersed in a catalyst mainly containing Pd or the like. Accordingly, as shown in FIG. 16, catalysts (223, 224) are attached to copper foils (221a, 222a) laminated on surfaces of insulation layers (21, 22) and on the inner-wall surfaces of via holes (21a, 22a).

Figure 17:
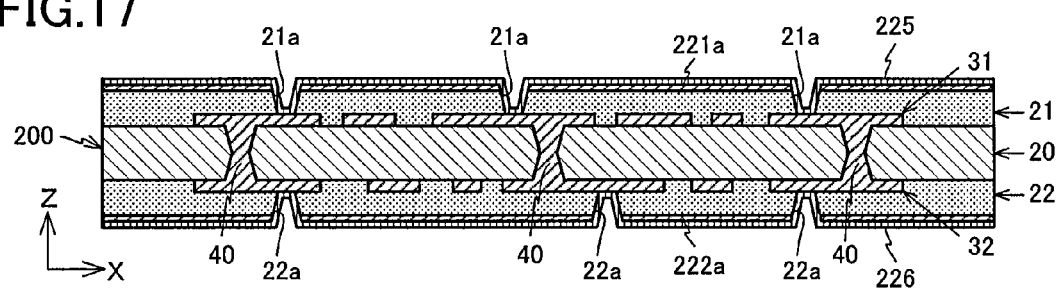
FIG. 17 is a view illustrating a step for manufacturing a wiring board.

Next, copper-clad laminate 200 is immersed in an electroless copper plating solution. Accordingly, as shown in FIG. 17, electroless plated film 225 is formed on the surface of insulation layer 21 and inner walls of via holes (21a). Also, electroless plated film 226 is formed on the surface of insulation layer 22 and the inner walls of via holes (22a).

Figure 18:
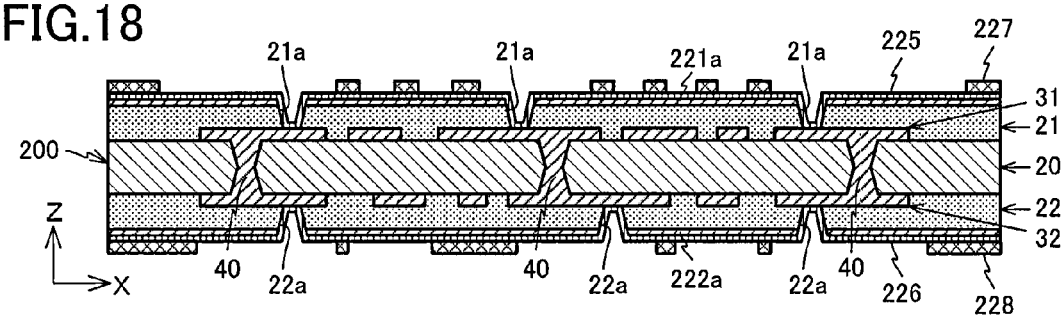
FIG. 18 is a view illustrating a step for manufacturing a wiring board.
Figure 19:
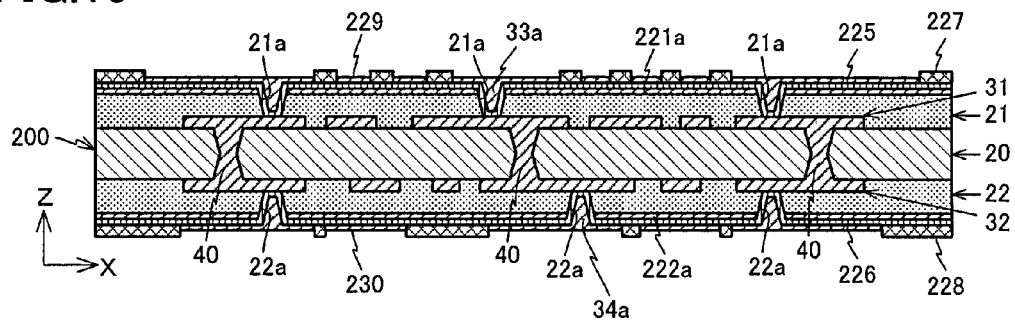
FIG. 19 is a view illustrating a step for manufacturing a wiring board.

Next, as shown in FIG. 18, plating resist 227 is formed on the upper surface of insulation layer 21 where electroless plated film 225 is formed, and plating resist 228 is formed on the lower surface of insulation layer 22 where electroless plated film 226 is formed. Then, electrolytic copper plating is performed on electroless plated films (225, 226) exposed from plating resists (227, 228). Accordingly, as shown in FIG. 19, electrolytic plated film 229 is formed on the surface of electroless plated film 225, and electrolytic plated film 230 is formed on the surface of electroless plated film 226. In addition, plating is filled in via holes (21a, 22a), and the plating forms via conductors (33a, 34a).

Figure 20:
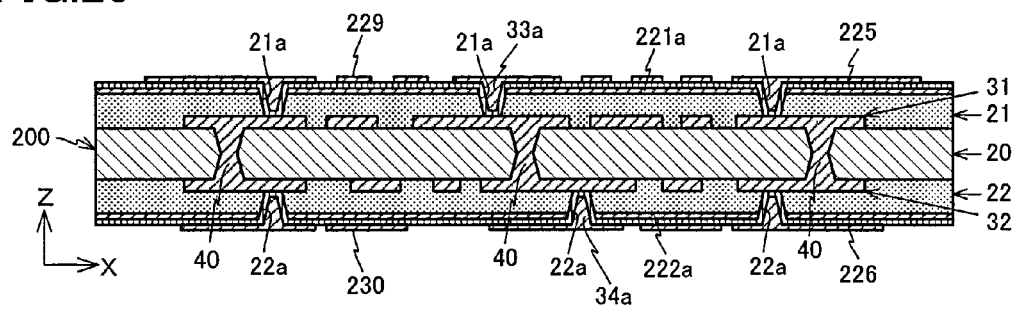
FIG. 20 is a view illustrating a step for manufacturing a wiring board.
Figure 21:
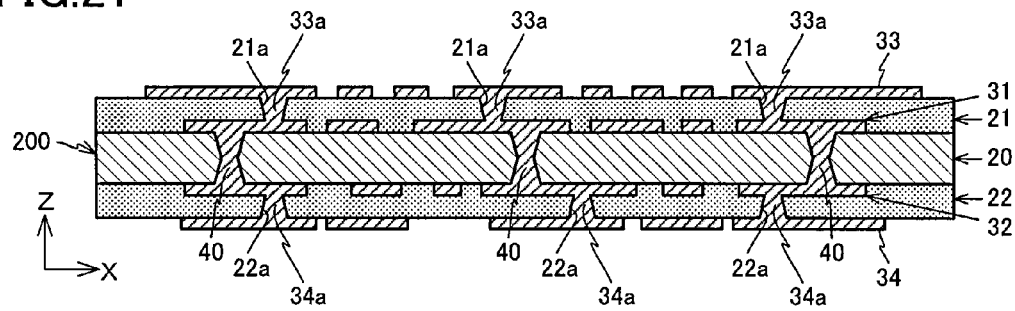
FIG. 21 is a view illustrating a step for manufacturing a wiring board.

Next, as shown in FIG. 20, plating resists (227, 228) are removed respectively from insulation layers (21, 22). Then, etching is performed to remove portions of electroless plated films (225, 226) and copper foils (221a, 222a) which had been covered by plating resists (227, 228). Accordingly, as shown in FIG. 21, copper foils (221a, 222a), electroless plated films (225, 226) and electrolytic plated films (229, 230) are patterned so that conductive patterns (33, 34) are formed.

Figure 22:
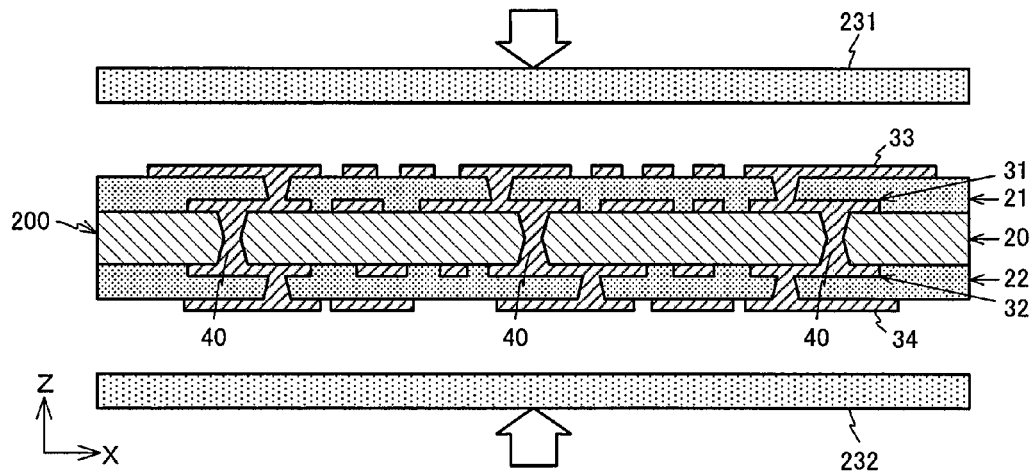
FIG. 22 is a view illustrating a step for manufacturing a wiring board.
Figure 23:
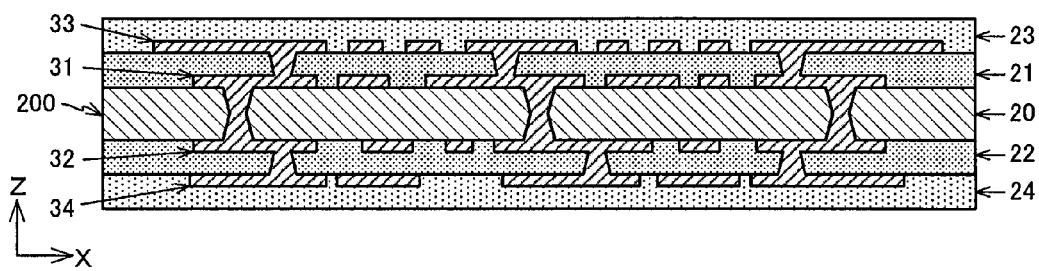
FIG. 23 is a view illustrating a step for manufacturing a wiring board.

Next, as shown in FIG. 22, photosensitive dry films (231, 232) are placed respectively on the upper surfaces of conductive patterns 33 and the lower surfaces of conductive patterns 34. Then, lamination treatment is conducted on photosensitive dry films (231, 232) to pressurize photosensitive dry film 231 onto the surfaces of insulation layer 21 and conductive patterns 33, and photosensitive dry film 232 onto the surfaces of insulation layer 22 and conductive patterns 34. In doing so, as shown in FIG. 23, solder-resist layer 23 is formed on the upper surface of insulation layer 21 covering conductive patterns 33, and solder-resist layer 24 is formed on the lower surface of insulation layer 22 covering conductive patterns 34.

Figure 24:
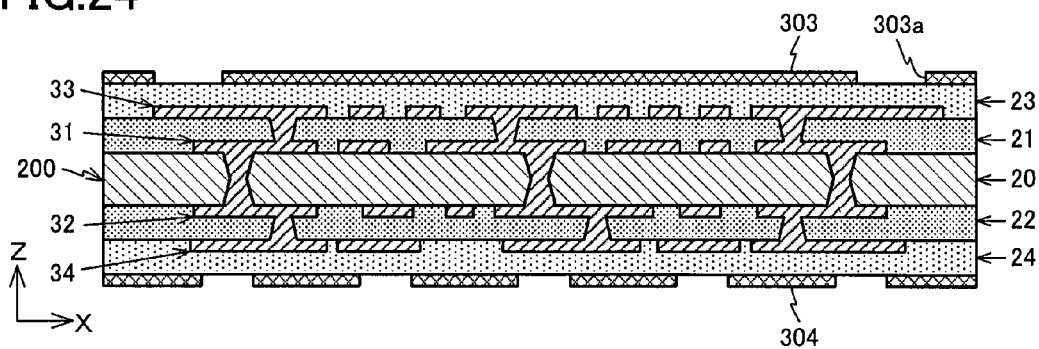
FIG. 24 is a view illustrating a step for manufacturing a wiring board.

Next, as shown in FIG. 24, photomask 303 is placed on the upper surface of solder-resist layer 23. Also, photomask 304 with openings at predetermined spots is placed on the lower surface of solder-resist layer 24.

Figure 25:
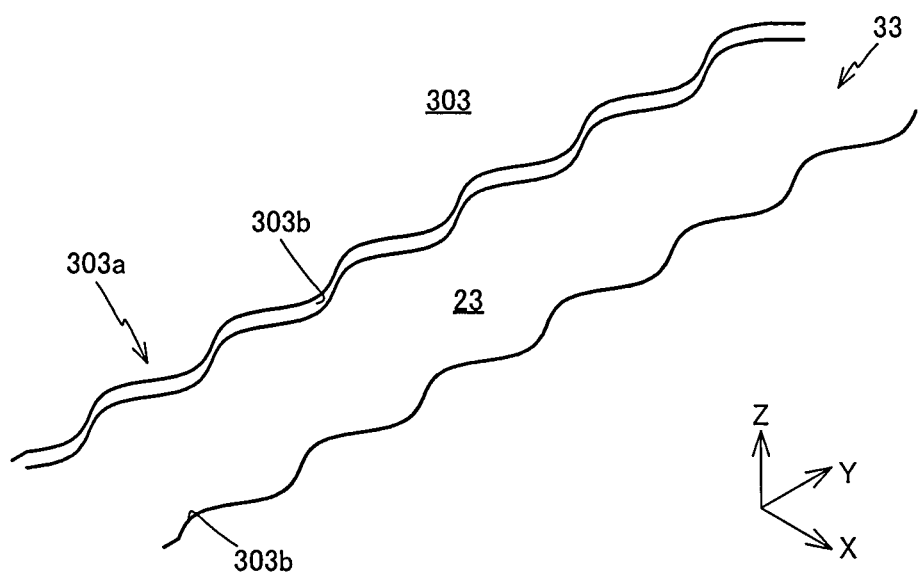
FIG. 25 is a perspective view showing a photomask.

Frame-shaped opening (303a) is formed in photomask 303. FIG. 25 is a magnified perspective view showing part of opening (303a). Opening (303a) is an opening similar to opening (23a) formed in solder-resist layer 23 shown in FIG. 1. As seen in FIG. 25, multiple convex portions (303b) are formed on the inner-wall surfaces of opening (303a), the same as in opening (23a).

Those convex portions (303b) are formed in positions corresponding to convex portions (23b) formed on the inner-wall surfaces of opening (23a) of solder-resist layer 23, as shown in FIG. 4, for example. Also, those convex portions (303b) have shapes the same as those of convex portions (23b) formed on the inner-wall surfaces of opening (23a) of solder-resist layer 23.

After photomask 303 is placed on the upper surface of solder-resist layer 23, ultraviolet rays are irradiated from the upper-surface side (+Z side) of photomask 303 toward the upper surface of solder-resist layer 23. Accordingly, solder-resist layer 23 exposed through opening (303a) of photomask 303 is exposed to light. Next, ultraviolet rays are irradiated from the lower-surface side (–Z side) of photomask 304 toward the lower surface of solder-resist layer 24. Accordingly, solder-resist layer 24 exposed through openings of photomask 304 is exposed to light.

Figure 26:
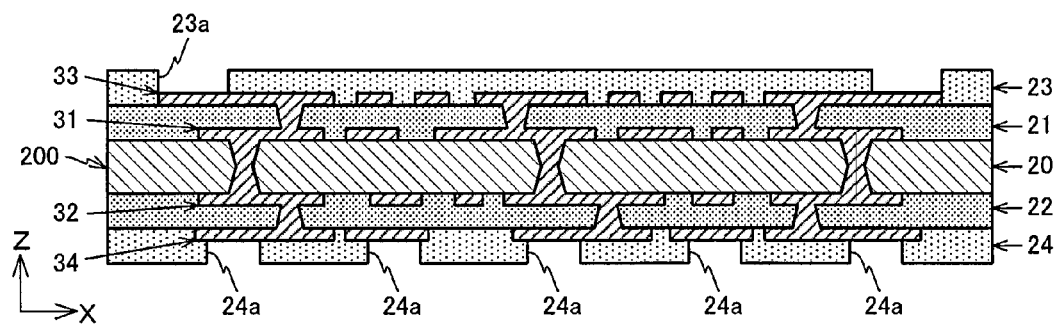
FIG. 26 is a view illustrating a step for manufacturing a wiring board.

Next, photomasks (303, 304) are removed and an alkaline solution is used to develop solder-resist layers (23, 24). In doing so, opening (23a) is formed in solder-resist layer 23 as shown in FIG. 26. As shown in FIGS. 3 and 4, for example, convex portions covering the (+X) side edge or the (–X) side edge of conductive patterns 33 are formed on the inner-wall surfaces of opening (23a). Then, conductive patterns 33 are exposed through opening (23a). Also, openings (24a) exposing conductive patterns 34 are formed in solder-resist layer 24 as shown in FIG. 21.

Next, a plasma cleaning treatment is conducted on conductive patterns 33 exposed through opening (23a) of solder-resist layer 23 and on conductive patterns 34 exposed through openings (24a) of solder-resist layer 24. In doing so, smears remaining on surfaces of conductive patterns (33, 34) are removed. Then, surfaces of conductive patterns 33 exposed through opening (23a) of solder-resist layer 23 and surfaces of conductive patterns 34 exposed through openings (24a) of solder-resist layer 24 are cleaned. Accordingly, oil content or the like attached to surfaces of conductive patterns (33, 34) is removed.

Next, acid treatment and soft etching are conducted on conductive patterns (33, 34) to remove oxide film from surfaces of conductive patterns (33, 34). Then, copper-clad laminate 200 is immersed in a predipping solution. A catalyst mainly containing Pd, for example, is attached to conductive patterns 33 exposed through opening (23a) of solder-resist layer 23 and conductive patterns 34 exposed through openings (24a) of solder-resist layer 24.

Next, surfaces of insulation layers (21, 22), solder-resist layers (23, 24) and conductive patterns (33, 34) are cleansed using a cleansing solution.

Figure 27:
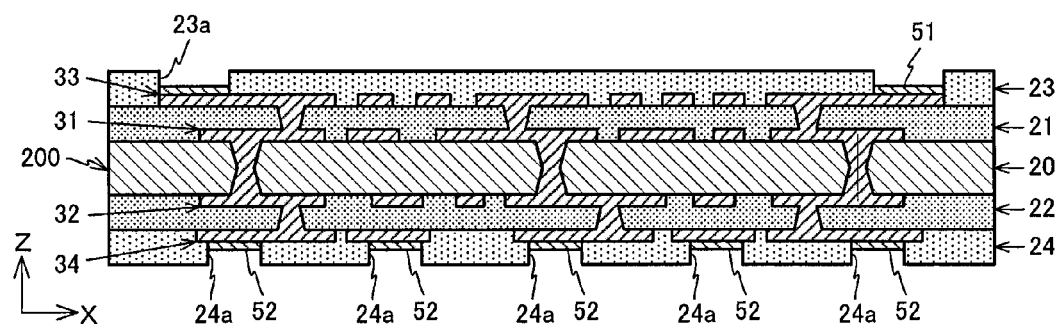
FIG. 27 is a view illustrating a step for manufacturing a wiring board.

Next, electrolytic Sn plating or electrolytic Ni/Au plating is performed on surfaces of conductive patterns (33, 34). In doing so, as shown in FIG. 27, solder connection layer 51 is formed on surfaces of conductive patterns 33 exposed through opening (23a) of solder-resist layer 23. Also, solder connection layer 52 is formed on surfaces of conductive patterns 34 exposed through openings (24a) of solder-resist layer 24. Accordingly, wiring board 10 on which to mount electronic component 100 is completed.

As shown in FIG. 2, electronic component 100 is mounted on wiring board 10 by connecting multiple pads (100a) to conductive patterns 33 where solder connection layer 51 is formed.

Next, underfill material is applied to electronic component 100 and to the upper surface (a surface of the (+Z) side) of wiring board 10. Accordingly, electronic component 100 is firmly secured to wiring board 10. Also, the underfill material is filled between electronic component 100 and conductive patterns 33, and the surfaces of pads (100a) and conductive patterns 33 are coated.

Figure 28:
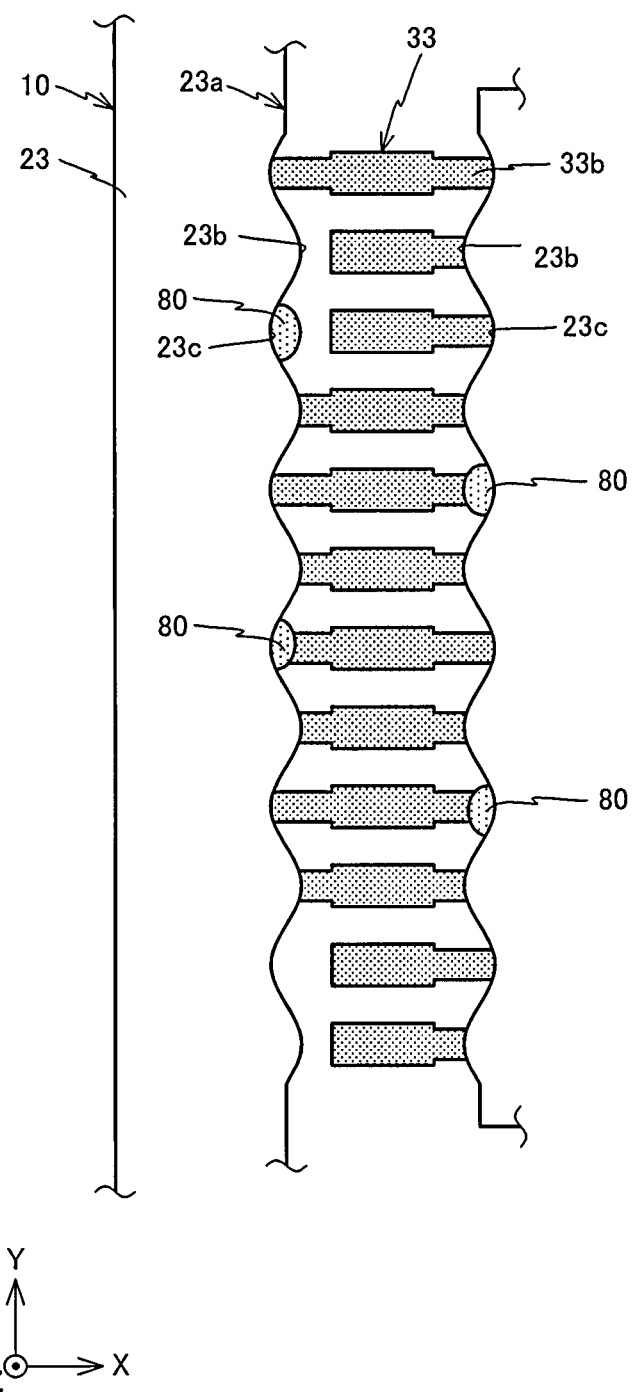
FIG. 28 is a view illustrating an effect on a wiring board.

As described above, in the present embodiment, convex portions (23b) protruding inward into opening portion (23a) and concave portions (23c) recessed outward from opening (23a) are alternately formed in solder-resist layer 23 as shown in FIGS. 3 and 4, for example. During a coating treatment using underfill material, the underfill material filled in opening (23a) spreads relatively well on tip portions of convex portions (23b). Therefore, as shown in FIG. 28, void 80, which may occur during the coating treatment, is more likely to occur in concave portion (23c), and is relatively less likely to occur near the tip of convex portion (23b). Thus, it is thought that void 80 is less likely to occur between adjacent conductive patterns 33 to bridge them, and defects due to short circuiting between conductive patterns 33 caused by void 80 are suppressed. As a result, sufficient insulation reliability of the wiring board is thought to be secured.

Figure 29:
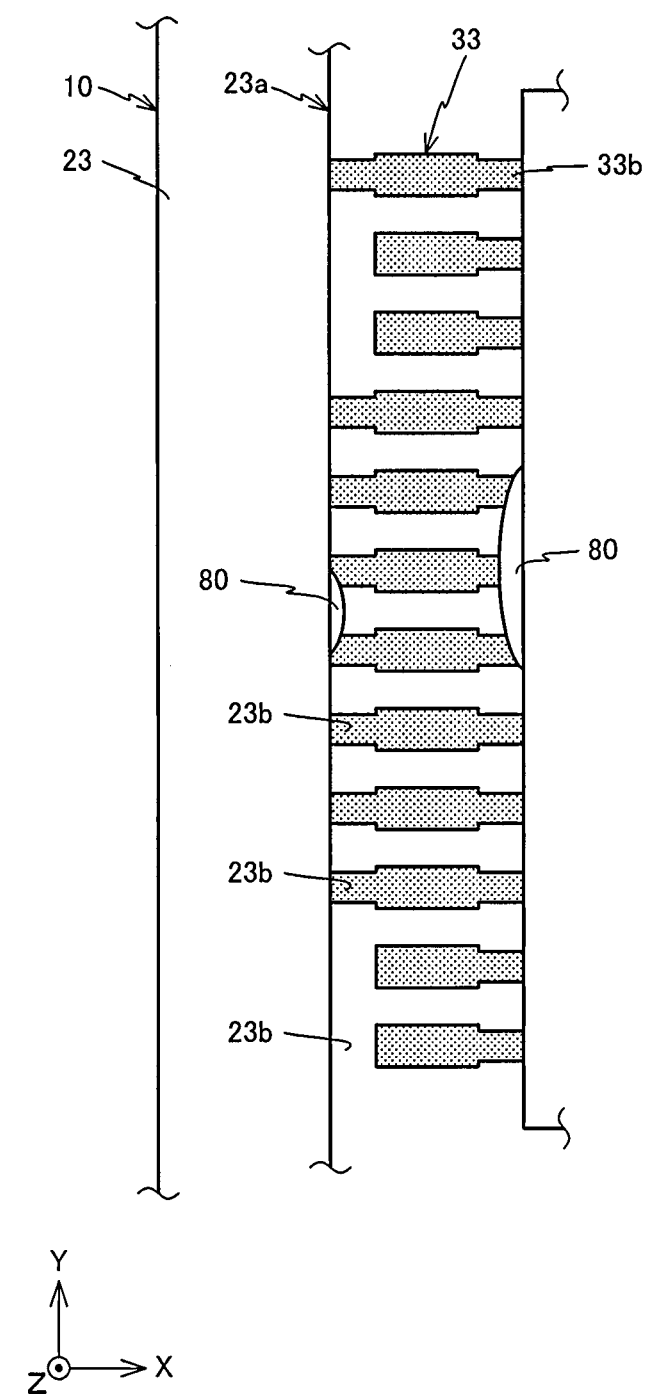
FIG. 29 is a view illustrating an effect on a wiring board.

For example, as shown in FIG. 29, if the inner-wall surfaces of opening (23a) are made flat, void 80 may occur along the inner-wall surface of opening (23a) bridging multiple conductive patterns 33. In such a case, electric field concentration or the like caused by void 80 occurs in wiring board 10, and it is thought that insulating strength may decrease between conductive patterns 33. However, as shown in FIG. 28, unless void 80 bridging conductive patterns 33 is formed, even if electric field concentration or the like occurs, insulating strength between conductive patterns 33 does not decrease, and defects caused by short circuiting between conductive patterns 33 due to void 80 are thought to be suppressed. As a result, sufficient insulation reliability of the wiring board is thought to be secured.

So far, an embodiment of the present invention has been described. However, the present invention is not limited to the above embodiment.

Figure 30:
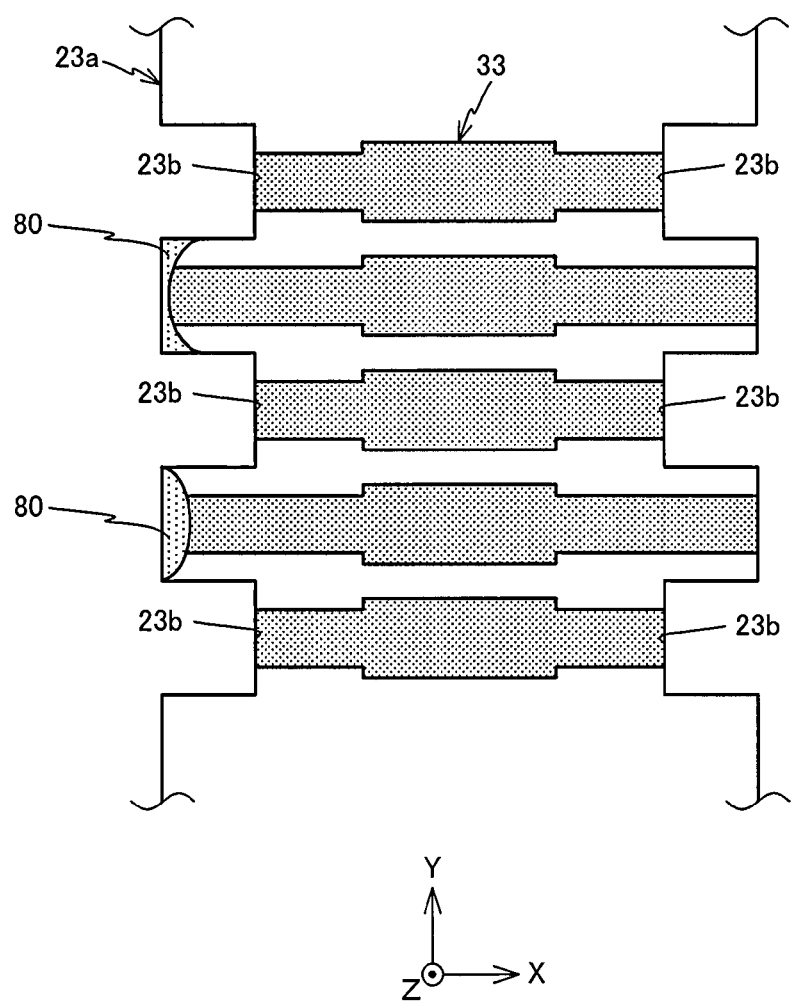
FIG. 30 is a view showing a modified example of convex portions.

For example, in the above embodiment, convex portions (23b) formed on the inner-wall surfaces of opening portion (23a) are curved surfaces which protrude toward the center of opening (23a). However, that is not the only option. For example, as shown in FIG. 30, convex portions (23b) may be shaped rectangular. When forming rectangular convex portions (23b), it is an option to set the size of convex portions (23b) in a direction of axis X to be equal to the array pitch of conductive patterns 33 in opening (23a), for example, at 40 μm, and the distance between adjacent convex portions (23b) at 80 μm, for example.

Figure 31:
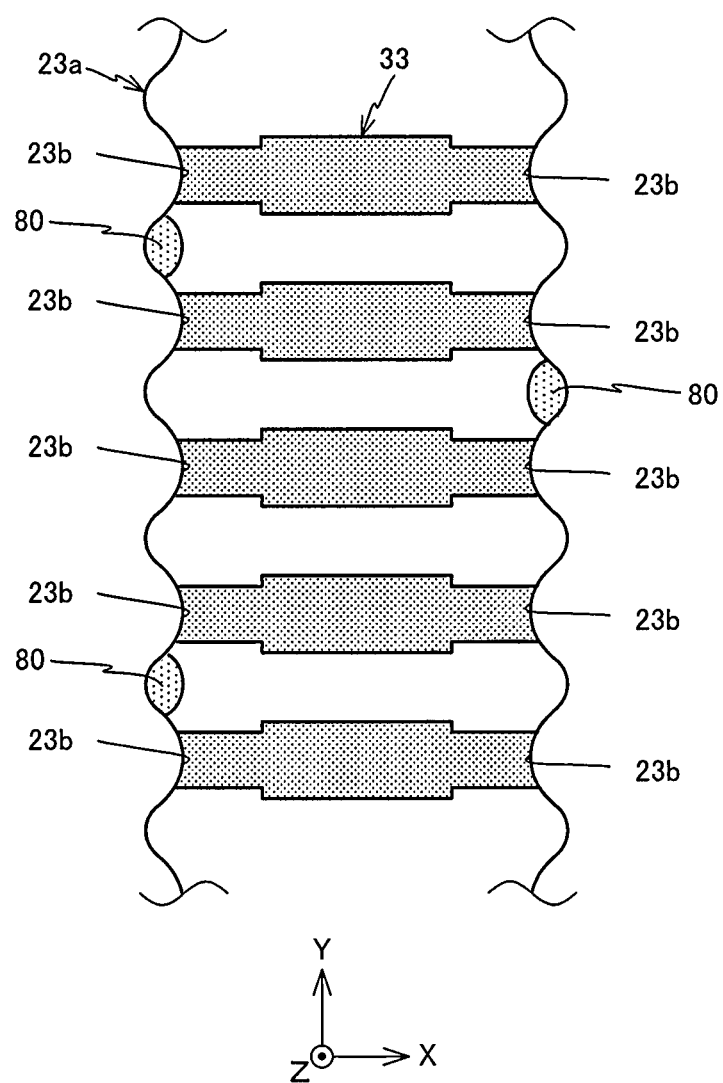
FIG. 31 is a view showing a modified example of convex portions.

In the above embodiment, by alternately forming convex portions (23b) to protrude into opening (23a) and concave portions (23c) to be recessed outward from opening (23a), the inner-wall surfaces of opening (23a) are shaped like a sine wave where concavo-convex shapes appear in a cycle. Conductive patterns 33 are positioned corresponding to convex portion (23b) or concave portion (23c). However, as seen in FIG. 28, void 80, which may occur during the coating treatment, is thought to occur in concave portion (23c), but be relatively less likely to occur near the tip of convex portion (23b). Therefore, as shown in FIG. 31, for example, convex portions (23b) may be formed on the inner-wall surface of opening portion (23a) to correspond to conductive patterns 33. Accordingly, void 80 bridging multiple conductive patterns 33 is relatively less likely to be formed, and defects due to short circuiting between conductive patterns 33 caused by void 80 are thought to be suppressed. As a result, sufficient insulation reliability of the wiring board is thought to be secured.

When forming convex portions (23b) and concave portions (23c) on the inner walls of opening (23a), it is an option to form convex portions (23b) and concave portions (23c) on the inner walls of opening (23a) in such a way that convex portions (23b) face each other and concave portions (23c) face each other, as shown in FIG. 28, for example.

Figure 32:
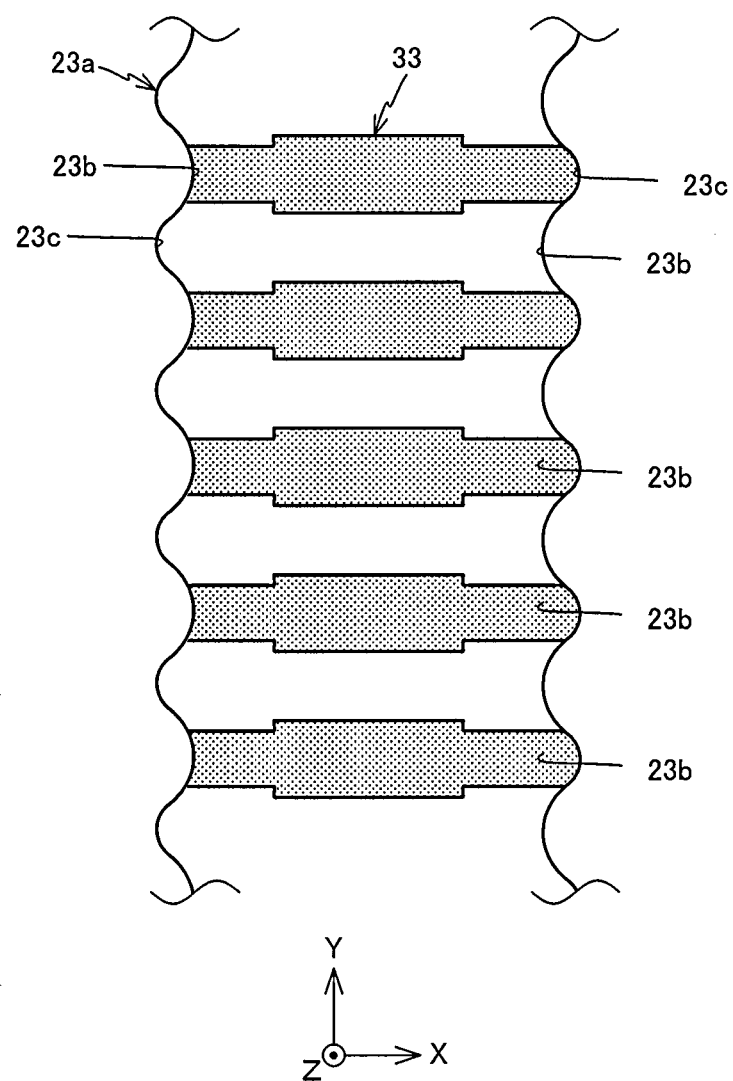
FIG. 32 is a view showing a modified example of convex portions.
Figure 33:
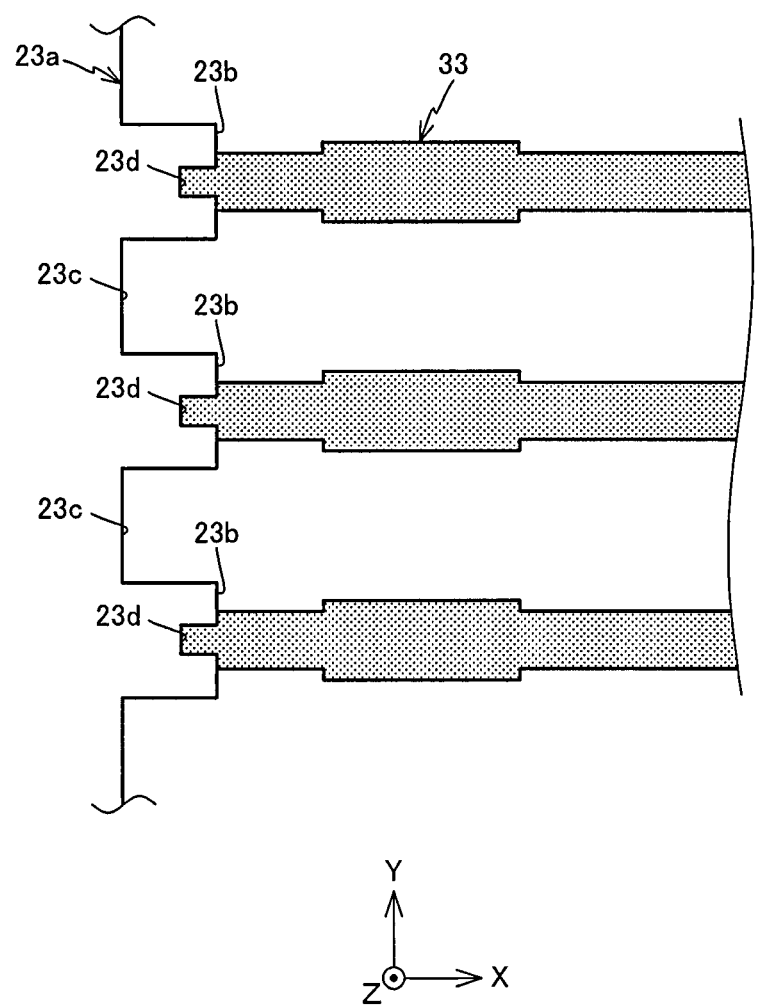
FIG. 33 is a view showing a modified example of convex portions.

Alternatively, as shown in FIG. 32, convex portions (23b) and concave portions (23c) may be formed in such a way that convex portion (23b) faces concave portion (23c). In such a case, among conductive patterns 33 with the same shape, the exposed areas are equal to each other as shown in FIG. 33.

In the above embodiment, a rectangular pad is formed in the center of exposed conductive pattern 33. However, that is not the only option, and the width of conductive pattern 33 in a direction of axis Y may be constant in opening (23a).

Figure 34:
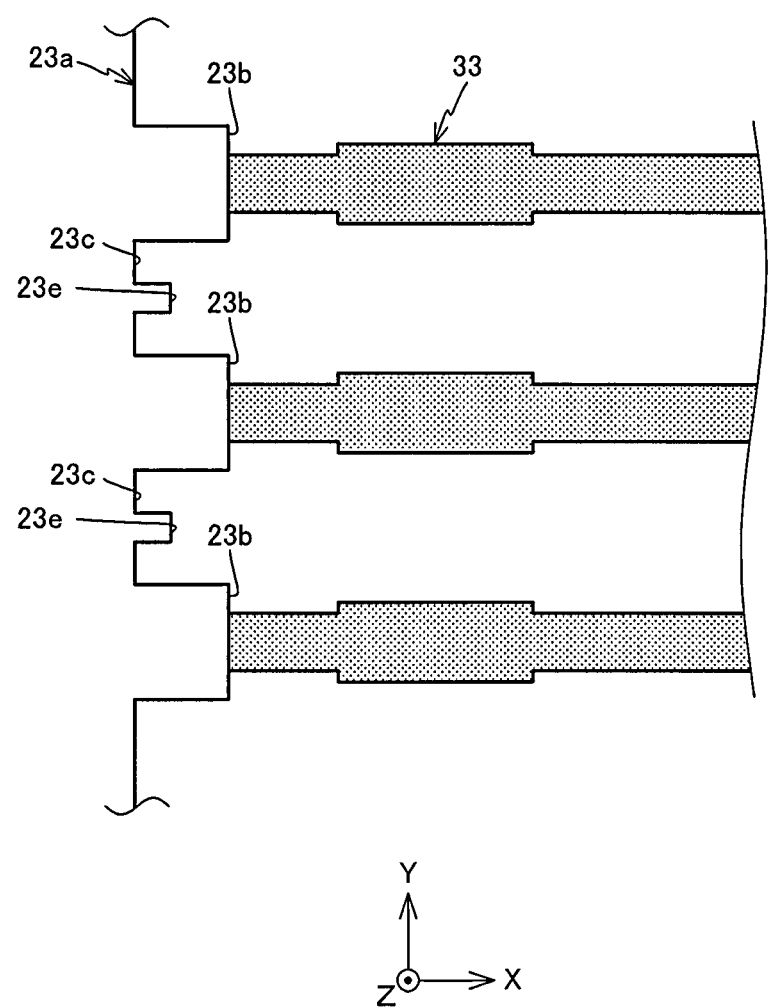
FIG. 34 is a view showing a modified example of concave portions.

In the above embodiment, as shown in FIG. 3, for example, an option is described where the edge made up of convex portions (23b) and concave portions (23c) is shaped in a continuous sine wave. However, that is not the only option. For example, as shown in FIG. 33, it is an option to form concave portion (23d) in convex portion (23b). Also, as shown in FIG. 34, convex portion (23e) may be formed in concave portion (23c).

In the above embodiment, electronic component 100 is such an electronic component that can be flip-chip mounted. However, electronic component 100 is not limited to such a type, and may be a semiconductor package to be connected to conductive patterns 33 of wiring board 10 by wire bonding.

Figure 35:
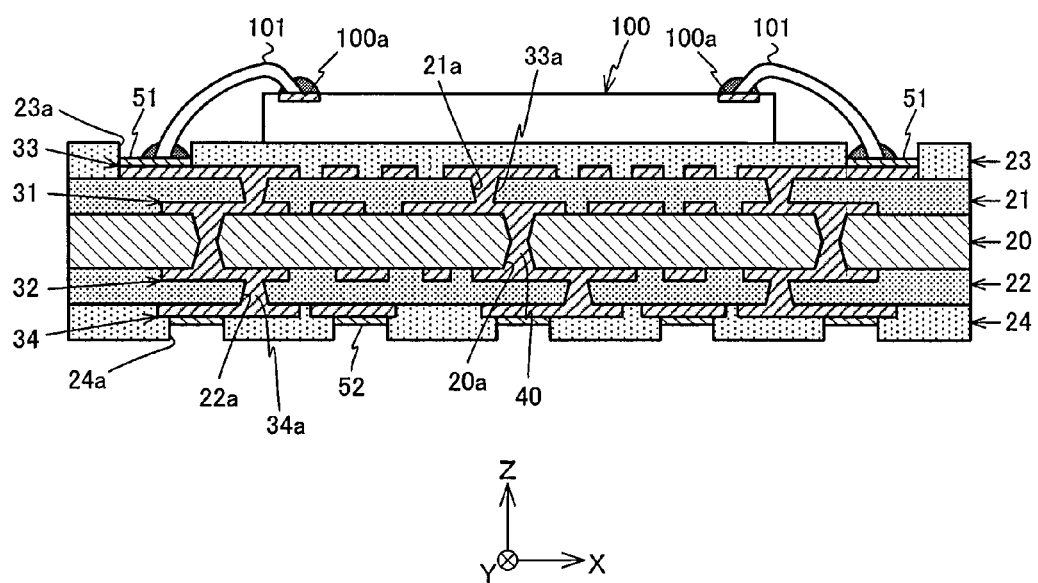
FIG. 35 is a view showing a modified example of a wiring board.

Such electronic component 100 is adhered to solder-resist layer 23 formed on the uppermost layer of wiring board 10. Then, as shown in FIG. 35, an end of wire 101 is soldered to pad (100*a*) formed on the upper surface of electronic component 100, and the other end of wire 101 is soldered to conductive pattern 33, so as to be electrically connected to conductive patterns 31~34 of wiring board 10.

In the above embodiment, as shown in FIGS. 2 and 3, the inner-wall surfaces of opening (23*a*) formed in solder-resist layer 23 are perpendicular to the XY surface. However, it is not the only option, and the inner-wall surfaces of opening (23*a*) may taper widening upward (in a +Z direction).

Materials of core substrate 20, insulation layers (21, 22) and solder-resist layers (23, 24) may be selected freely according to the usage proposed for wiring board 10. For example, instead of prepreg, insulation layers (21, 22) may also be formed with liquid or film-type thermosetting resins, their compositions, or RCF (resin-coated copper foil).

As the material for electroless plating, nickel, titanium, chrome or the like may also be used instead of copper. Instead of electroless plating, PVD film or CVD film may be used. When PVD film or CVD film is used, a catalyst is not required.

In the same manner, as the material for electrolytic plated film, nickel, titanium, chrome or the like may also be used instead of copper.

In the above embodiment, an example is described where through-hole conductor 40 is formed as a filled conductor by filling plating in penetrating hole (20*a*) formed in core substrate 20. However, that is not the only option, and a conformal conductor may be formed by forming plated film on the inner-wall surface of penetrating hole (20*a*) formed in core substrate 20.

In the above embodiment, an example is described where a via conductor formed in an insulation layer is a filled conductor. However, that is not the only option, and a via conductor may be a conformal conductor.

Plating indicates depositing a conductor (such as metal) in a layer on a surface of metal or resin, and also indicates the deposited conductor (such as a metal layer). Also, plating includes dry plating such as PVD (physical vapor deposition) and CVD (chemical vapor deposition) in addition to wet plating such as electrolytic plating and electroless plating.

How to form and pattern conductive patterns 31~34 is not limited specifically. A semi-additive or subtractive method may be appropriately selected according to the purposes proposed for wiring board 10.

Underfill material is used when conducting a coating treatment on a wiring board with a mounted electronic component. By doing so, the electronic component and the wiring board are firmly secured. In addition, bumps of the electronic component and pads of the wiring board are covered with the underfill material, and oxidation and corrosion are suppressed from progressing.

However, when conductive patterns of a wiring board are fine, liquid underfill material is not sufficiently spread between an electronic component and the wiring board during a coating treatment using such underfill material, resulting in voids in the underfill material filled between the electronic component and the wiring board. In the vicinity of such a void, it is thought, for example, that tin (Sn) fused during a reflow may connect within the void and cause short circuiting of conductive patterns, or stress from electric field concentration may reduce insulating strength and cause short circuiting of conductive patterns accordingly.

A wiring board according to one aspect of the present invention has the following: an interlayer insulation layer; a conductive pattern group which is made up of first conductive patterns and second conductive patterns alternately positioned on the interlayer insulation layer; and a solder-resist layer which is formed on the interlayer insulation layer and has an opening to partially expose the conductive pattern group. In such a wiring board, the edge of the solder-resist-layer opening that intersects the conductive pattern group has a concavo-convex shape made up of convex portions and concave portions, and a convex portion covering a first conductive pattern does not extend to a second conductive pattern adjacent to the first conductive pattern covered by the convex portion.

A method for manufacturing a wiring board according to another aspect of the present invention includes the following: on an insulation layer, forming a conductive pattern group which is made up of first conductive patterns and second conductive patterns alternately positioned; and on the insulation layer, forming a solder-resist layer which has an opening to partially expose the conductive pattern group. In such a wiring board, the edge of the solder-resist-layer opening that intersects the conductive pattern group has a concavo-convex shape made up of convex portions and concave portions, and a convex portion covering a first conductive pattern does not extend to a second conductive pattern adjacent to the first conductive pattern covered by the convex portion.

Wiring boards according to the present invention are suitable to be used as circuit boards for electronic devices. Also, methods for manufacturing a wiring board according to the present invention are suitable for manufacturing circuit boards for electronic devices.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
an interlayer insulation layer;
a plurality of conductive patterns formed on the interlayer insulation layer; and
a solder-resist layer formed on the interlayer insulation layer and having an opening partially exposing the plurality of conductive patterns,
wherein the solder-resist layer has an edge portion bordering the opening and intersecting the conductive patterns, the edge portion of the solder-resist layer has a concavo-convex shape having a plurality of convex portions and a plurality of concave portions such that the convex portions and the concave portions are alternately intersecting the conductive patterns, and the concavo-convex shape of the edge portion has the convex portions and concave portions in at least one of a wave form in a cycle and rectangular forms.

2. The wiring board according to claim 1, wherein the solder-resist layer has an opposing edge portion bordering the opening and formed on an opposite side of the opening with respect to the edge portion, and the opposing edge portion of the solder-resist layer has a concavo-convex shape having a plurality of convex portions and a plurality of concave portions such that the convex portions and concave portions of the opposing edge portion are alternately intersecting the conductive patterns.

3. The wiring board according to claim 1, wherein the solder-resist layer has an opposing edge portion bordering the opening and formed on an opposite side of the opening with respect to the edge portion, and the opposing edge portion of the solder-resist layer has a concavo-convex shape having a plurality of convex portions and a plurality of concave portions such that the convex portions and concave portions of the opposing edge portion are alternately intersecting the conductive patterns and the convex portions of the edge portion and opposing edge portion face each other.

4. The wiring board according to claim 1, wherein the solder-resist layer has an opposing edge portion bordering the opening and formed on an opposite side of the opening with respect to the edge portion, and the opposing edge portion of the solder-resist layer has a concavo-convex shape having a plurality of convex portions and a plurality of concave portions such that the convex portions and concave portions of the opposing edge portion are alternately intersecting the conductive patterns and the convex portions of the edge portion face the concave portions of the opposing edge portion.

5. The wiring board according to claim 1, wherein the opening of the solder-resist layer is formed such that an exposed area of each of the conductive patterns is set substantially equal.

6. The wiring board according to claim 1, wherein the concavo-convex shape of the edge portion has the convex portions and concave portions forming a wave form in a cycle.

7. The wiring board according to claim 1, wherein the concavo-convex shape of the edge portion has the convex portions and concave portions in rectangular forms.

8. The wiring board according to claim 2, wherein the concavo-convex shape of the edge portion has the convex portions and concave portions forming a wave form in a cycle, and the concavo-convex shape of the opposing edge portion has the convex portions and concave portions forming a wave form in a cycle.

9. The wiring board according to claim 3, wherein the concavo-convex shape of the edge portion has the convex portions and concave portions forming a wave form in a cycle, and the concavo-convex shape of the opposing edge portion has the convex portions and concave portions forming a wave form in a cycle.

10. The wiring board according to claim 4, wherein the concavo-convex shape of the edge portion has the convex portions and concave portions forming a wave form in a cycle, and the concavo-convex shape of the opposing edge portion has the convex portions and concave portions forming a wave form in a cycle.

11. A method for manufacturing a wiring board, comprising:
forming a plurality of conductive patterns on an insulation layer;
forming on the insulation layer a solder-resist layer covering the conductive patterns; and
forming an opening in the solder-resist layer such that the conductive patterns are partially exposed from the solder-resist layer,
wherein the forming of the opening comprises forming in the solder-resist layer an edge portion intersecting the conductive patterns having a concavo-convex shape having a plurality of convex portions and a plurality of concave portions such that the convex portions and the concave portions are alternately intersecting the conductive patterns, and the forming of the opening comprises at least one of forming the concavo-convex shape of the edge portion having the convex portions and concave portions forming a wave form in a cycle and forming the concavo-convex shape of the edge portion having the convex portions and concave portions in rectangular forms.

12. The method for manufacturing a wiring board according to claim 11, wherein the forming of the opening comprises forming an opposing edge portion shaping an opposite side of the opening with respect to the edge portion and having a concavo-convex shape having a plurality of convex portions and a plurality of concave portions such that the convex portions and concave portions of the opposing edge portion are alternately intersecting the conductive patterns.

13. The method for manufacturing a wiring board according to claim 11, wherein the forming of the opening comprises forming an opposing edge portion shaping an opposite side of the opening with respect to the edge portion and having a concavo-convex shape having a plurality of convex portions and a plurality of concave portions such that the convex portions and concave portions of the opposing edge portion are alternately intersecting the conductive patterns and the convex portions of the edge portion and opposing edge portion face each other.

14. The method for manufacturing a wiring board according to claim 11, wherein the forming of the opening comprises forming an opposing edge portion shaping an opposite side of the opening with respect to the edge portion and having a concavo-convex shape having a plurality of convex portions and a plurality of concave portions such that the convex portions and concave portions of the opposing edge portion are alternately intersecting the conductive patterns and the convex portions of the edge portion face the concave portions of the opposing edge portion.

15. The method for manufacturing a wiring board according to claim 11, wherein the forming of the opening comprises forming the opening of the solder-resist layer such that an exposed area of each of the conductive patterns is set substantially equal.

16. The method for manufacturing a wiring board according to claim 11, wherein the forming of the opening comprises forming the concavo-convex shape of the edge portion having the convex portions and concave portions forming a wave form in a cycle.

17. The method for manufacturing a wiring board according to claim 11, wherein the forming of the opening comprises forming the concavo-convex shape of the edge portion having the convex portions and concave portions in rectangular forms.

18. The method for manufacturing a wiring board according to claim 12, wherein the forming of the opening comprises forming the concavo-convex shape of the edge portion having the convex portions and concave portions forming a wave form in a cycle and forming the concavo-convex shape of the opposing edge portion having the convex portions and concave portions forming a wave form in a cycle.

19. The method for manufacturing a wiring board according to claim 13, wherein the forming of the opening comprises forming the concavo-convex shape of the edge portion having the convex portions and concave portions forming a wave form in a cycle and forming the concavo-convex shape of the opposing edge portion having the convex portions and concave portions forming a wave form in a cycle.

20. The method for manufacturing a wiring board according to claim 14, wherein the forming of the opening comprises forming the concavo-convex shape of the edge portion having the convex portions and concave portions forming a wave form in a cycle and forming the concavo-convex shape of the opposing edge portion having the convex portions and concave portions forming a wave form in a cycle.

* * * * *